(12) United States Patent
Kimura et al.

(10) Patent No.: US 6,200,827 B1
(45) Date of Patent: Mar. 13, 2001

(54) METHOD FOR MANUFACTURING A SEMICONDUCTOR LIGHT EMITTING DEVICE

(75) Inventors: Yoshinori Kimura; Hiroyuki Ota, both of Saitama-ken (JP)

(73) Assignee: Pioneer Electronic Corporation, Tokyo (JP)

( * ) Notice: Subject to any disclaimer, the term of this patent is extended or adjusted under 35 U.S.C. 154(b) by 0 days.

(21) Appl. No.: 09/224,356

(22) Filed: Jan. 4, 1999

(30) Foreign Application Priority Data

Jan. 8, 1998 (JP) .................................... 10-013204

(51) Int. Cl.⁷ .................................................. H01L 21/00
(52) U.S. Cl. ...................................................... 438/46
(58) Field of Search ................... 438/38, 46, 47, 438/507, 508, 509; 257/94, 103; 117/952

(56) References Cited

FOREIGN PATENT DOCUMENTS

08115880 * 5/1996 (JP) .

OTHER PUBLICATIONS

S. Nakamura et al., "Thermal Annealing Effects on P–Type Mg–Doped GaN Films", Jpn. J. Appl. Phys., vol. 31, pp. L139–L142, Feb. 1992.*
W. Gotz et al., "Hydrogen passivation of Mg acceptors in GaN grown by metalorganic chemical vapor deposition", Appl. Phys. Lett., vol. 67, pp. 2666–2668, Feb. 1992.*

* cited by examiner

*Primary Examiner*—Charles Bowers
*Assistant Examiner*—Keith Christianson
(74) *Attorney, Agent, or Firm*—Arent Fox Kintner Plotkin & Kahn, PLLC

(57) ABSTRACT

A semiconductor light emitting device has at least a substrate, an n-type GaN type semiconductor layer, an active layer, and a p-type GaN type semiconductor layer which are laminated on each other. In a first annealing process, the semiconductor light emitting device is annealing-processed thereby activating the p-type GaN type semiconductor layer. A metal mask is formed to cover an electric current introducing area of a surface of the p-type GaN type semiconductor layer. In a second annealing process the semiconductor light emitting device is annealing-processed thereby inactivating the p-type GaN type semiconductor layer.

4 Claims, 3 Drawing Sheets

METHOD FOR MANUFACTURING A SEMICONDUCTOR LIGHT EMITTING DEVICE

BACKGROUND OF THE INVENTION

The present invention relates to a method for manufacturing a light emitting device.

Recently, the semiconductor light emitting device using gallium nitride and related compound semiconductors (hereinafter called III-V nitride semiconductors) has attracted a lot of attention. Accordingly, the device structure suitable for the III-V nitride semiconductor has been studied.

Here, III-V nitride semiconductor is defined as the semiconductor of the compound of GaN of III group atom with N of V group atom, the compound of Ga of III group atom with another III group atom such as Al, In and others which is substituted for a part of Ga, and the compound of N of V group atom with another V group atom such as P, As and others which is substituted for a part of N.

Heretofore, various types of element structure have been proposed in order to improve the characteristics of the semiconductor light emitting device. As a method for improving a basic characteristic such as the threshold of oscillation, there is a method for providing structure to restrict the path for electric current.

As one of the methods to restrict the electric current path, there is a method of removing an area around the path in a p-type layer of the surface of the semiconductor by wet etching or dry etching.

However, the method has following problems.

The method of wet etching can not be used, because an etching solution suitable for the semiconductor of the GaN related compound has not been discovered.

In the method by the dry etching, an active layer may be damaged by the etching of the p-type layer, thereby reducing the light emitting characteristic.

Therefore, at the present time, a method by annealing process is devised as shown in FIGS. 3a and 3b.

A semiconductor light emitting device of FIG. 3a has a layer structure comprising a III-V nitride semiconductor on a substrate 21, which comprises an n-type buffer layer 22, n-type GaN clad layer 23, n-type AlGaN clad layer 24, InGaN active layer 25, p-type clad layer 26, and p-type GaN contact layer 27.

In the method, the entire semiconductor layer is annealing-processed, thereby activating the p-type layers. Thereafter, a mask 28 of insulation material is mounted on the surface of the p-type contact layer 27, and the semiconductor is annealing-processed in an ambient of hydrogen. As a result, p-type layers 29 not covered by the mask 28 are made high resistance to form a narrow electric current path as shown in FIG. 3a.

Next, the mask 28 is removed and a p-electrode 30 of Au is mounted on a current injection area of the p-type contact layer 27 as shown in FIG. 3b.

On the other hand, the n-type clad layer 23 is exposed by etching a part of the semiconductor layer (FIG. 3a), and an n-electrode 31 of Au is mounted on the surface of the n-type clad layer 23, thereby forming a semiconductor light emitting device (FIG. 3b).

However, in the method, the mask 28 of insulation material must be removed, and the removed portion is exposed in the atmosphere. The exposed portion is oxidized to form an oxidation film on the portion. Furthermore, in order to reduce the contact resistance of the electrode 31, the semiconductor layer is annealing-processed again. As a result, hydrogen diffuses from the high resistance portion to the low resistance portion of the narrow path, thereby increasing the resistance of the narrow path.

SUMMARY OF THE INVENTION

An object of the present invention is to provide a method for making a semiconductor light emitting device which may easily form an electric current injection area, easily manufacture the light emitting device using mass production, and reduce the contact resistance with the electrode.

According to the present invention, there is provided a method for manufacturing a semiconductor light emitting device having a stack structure which consists of at least an n-type III-V nitride semiconductor layer, an active layer, and a p-type III-V nitride semiconductor layer on a substrate.

The method comprises the steps of a first annealing process for the purpose of activating the p-type III-V nitride semiconductor layer, forming a metal mask on the area of the III-V nitride semiconductor area where electric current is to be injected, a second annealing process for inactivating the p-type III-V nitride semiconductor layer except for the masked area.

The first annealing process is performed in an ambient of nitrogen, and the second annealing process is performed in an ambient including hydrogen or hydrides.

The method further comprises forming a p-electrode that covers the mask on the surface of the p-type and forming an n-electrode on the n-type III-V nitride semiconductor layer after the second annealing process.

The metal of the mask is one of Ni, Pt, Pd and Au.

These and other objects and features of the present invention will become more apparent from the following detailed description with reference to the accompanying drawings.

Figure 1:
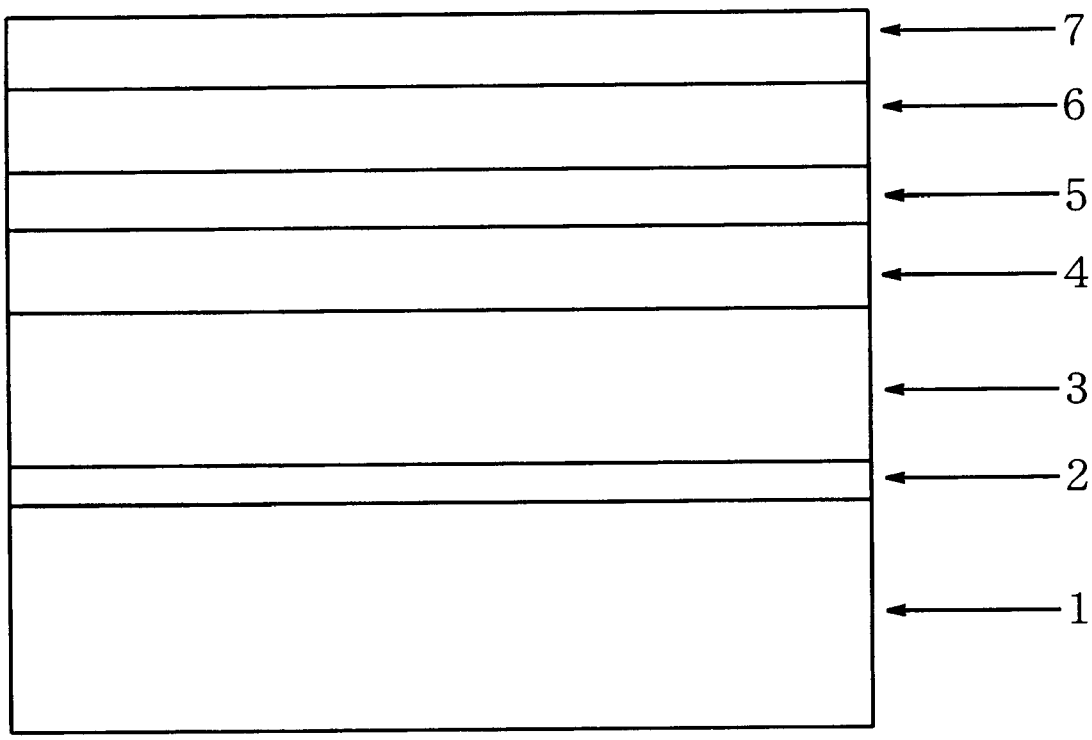
FIG. 1 is a side view for explaining construction of a semiconductor device according to the present invention.

DETAILED DESCRIPTION OF THE PREFERRED EMBODIMENT (I) Structure of a semiconductor device Referring to FIG. 1, the semiconductor device comprises a III-V nitride compound semiconductor grown on a substrate 1 of sapphire.

The semiconductor comprises a low temperature buffer layer 2 of aluminum nitride (hereinafter called AlN), clad layer 3 of n-type GaN in which Si is doped, clad layer 4 of n-type AlGaN in which Si is doped, active layer 5 of In(indium)GaN, clad layer 6 of p-type AlGaN in which Mg is doped, contact layer 7 of p-type GaN in which Mg is doped.

As the impurity atom doped in the n-type GaN layer, an atom of 4A group such as C, Ge may be used other than Si, and as the impurity atom doped in the p-type GaN layer, an atom of 2A group atom such as Be, Ca and others and an atom of 2B group atom such as Zn may be used.

(II) Manufacturing method of the semiconductor device (Growing process)

The substrate 1 of sapphire is loaded in a reactor of the MOCVD (Metal Organic Chemical Vapor Deposition) type and held in a hydrogen flow at 1050° C. for ten minutes, so that the surface of the substrate 1 is heat-cleaned. Subsequently the temperature of the substrate 1 is reduced to 600° C., and $NH_3$ as a nitrogen precursor and TMA (trimethyl aluminium) as an Al precursor are introduced in the reactor, so that the buffer layer 2 of AlN is grown on the substrate 1 in the thickness of 0.05 $\mu$m.

Next, the n-type clad layer is grown between 700° C. and 1200° C. using $NH_3$ and TMG (trimethyl gallium) as precursors, the thickness is 2 $\mu$m. At that time, Me—$SiH_3$ (methyl silane) is used as a precursor for n-type dopant.

Thereafter, TMA is further added to the above described gases, thereby growing an n-type AlGaN layer doped with Si. Thus the n-type AlGaN cladding layer 4 is grown about 0.2 $\mu$m thick.

Next, TMI (trimethyl indium), TMG and $NH_3$ are introduced in the reactor, so that the InGaN active layer 5 is grown about 0.02 $\mu$m thick.

Subsequently, the p-type AlGaN cladding layer 6 is grown by use of identical gases of n-type cladding layer except for Me—SiH and $CP_2Mg$ (biscyclopentadiniel magnesium) or DMZn (dimethylzinc).

Lastly, the p-type GaN contact layer 7 is grown about 0.2 $\mu$m thick using identical gases of n-type GaN layer 3 except for Me—$SiH_3$, and $CP_2Mg$ or DEZn.

Thus, each layer of the III-V nitride semiconductor is laminated.

(Device forming process)

A device forming process which is a characterized as part of the present invention is hereinafter described.

Figure 2A:
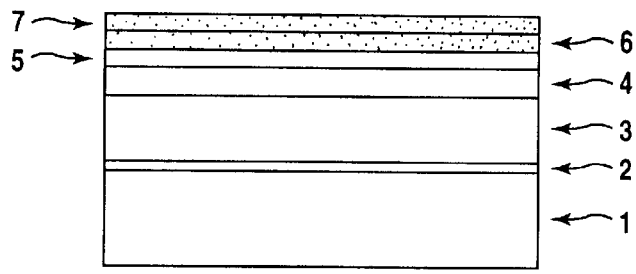
FIGS. 2a to 2d are side views of the device for explaining a manufacturing process.

In the III-V nitride semiconductor stack structure made by the above described epitaxial growth process, the p-type semiconductor layers 6 and 7 in FIG. 2a are high resistance. Therefore, first of all the resistance lowering process of the p-type semiconductor layers 6 and 7 are carried out.

Figure 2B:
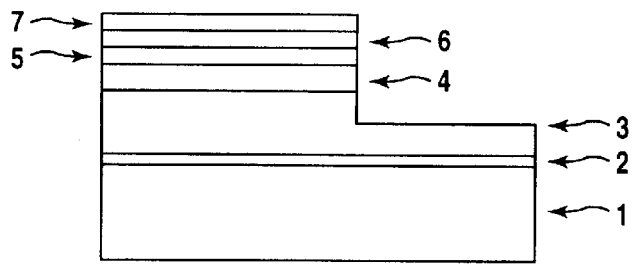

Before the resistance lowering process, an etching process is performed in order to expose the n-electrode. In the etching, an etching mask is formed by photolithography, unnecessary portions of the p-type GaN layers are removed by RIE (Reactive Ion Etching), thereby partially exposing the n-type GaN layer 3 (FIG. 2b).

This process is not necessary when the n-electrode is to be exposed at another location. Furthermore, the removing process is not necessarily first performed.

After the partial exposing of the n-type GaN layer 3, a first annealing process is carried out as follows in order to reduce the resistance.

The entire semiconductor layer is put in a nitrogen ambient at about 800° C. for about 20 minutes, so that the p-type layers are activated to reduce the resistance due to the division of the combination of Mg, Zn and H which are dopants in the p-type layer.

Figure 2C:
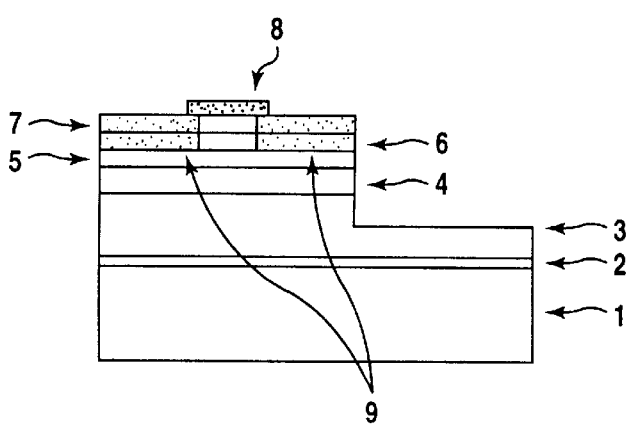

Next, as shown in FIG. 2c, a metal mask 8 is formed on the contact layer 7 to cover a portion which is to be a current introducing area. The metal mask 8 stripes having a width of 2 to 20 $\mu$m. The metal mask is formed by the photolithography, using one of Ni, Pt, Pd and Au each of which has a large work function. In particular, it is preferable to use a metal not having hydrogen permeability and having a good characteristic in electrical contact with the semiconductor layer of the p-type GaN. For example, although Pd has hydrogen permeability, it can be used by overlaying a film not having hydrogen permeability such as $SiO_2$.

The overlaying of an insulator such as $SiO_2$ on the metal mask 8 is effective in the following phenomena.

For example, in the case where a metal catalyzing hydrogen or hydrogen compound is used as a mask, the hydrogen or hydrogen compound is dissolved by the catalysis on the surface of the mask during the annealing process so that excessive active hydrogen generates, which results in increase of the active hydrogen density in the ambience at the annealing process. The excessive active hydrogen diffuses in the underside of the metal mask, which is to be kept at low resistance. Consequently the portion may be made high resistance.

In order to prevent the generation of excessive active hydrogen due to the catalysis to hydrogen or hydrogen compound on the surface of the metal mask, it is desirable to overlay $SiO_2$ or the like.

Thereafter, a second annealing process is carried out, wherein the entire semiconductor having the metal mask 8 is annealing-processed in an ambient including hydrogen or a hydrogen compound at about 800° C. for about 15 minutes. By the treatment, the hydrogen in the ambience enters the semiconductor of the p-type layer, thereby combining Mg, Zn and H which are dopants in the p-type layer, and inactivating the p-type layer designated by a reference numeral 9 in FIG. 2c, causing it to increase the resistance to a high value ($10^5$ $\Omega$cm). At that time, the p-type layer covered by the mask 8 is maintained at a low resistance.

Figure 2D:
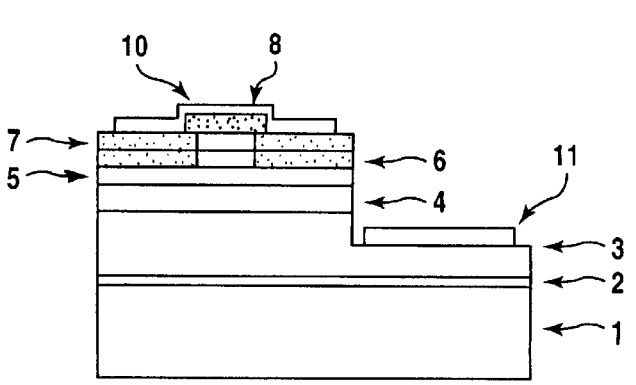
Figure 3A:
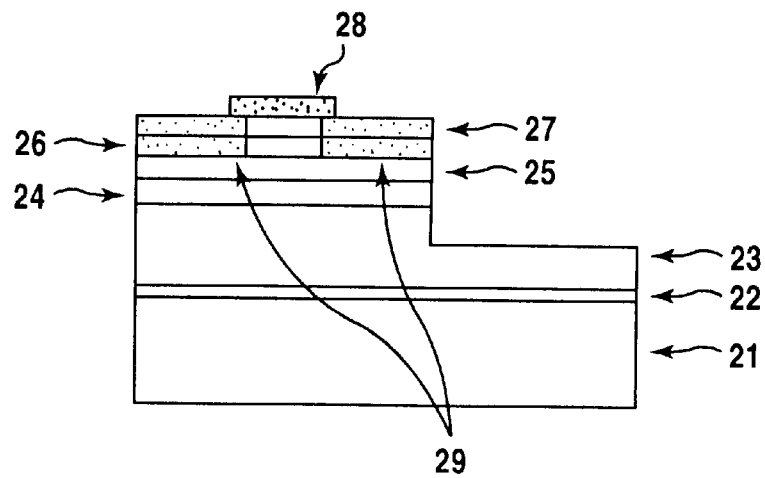
FIGS. 3a and 3b are side views showing a conventional semiconductor device.
Figure 3B:
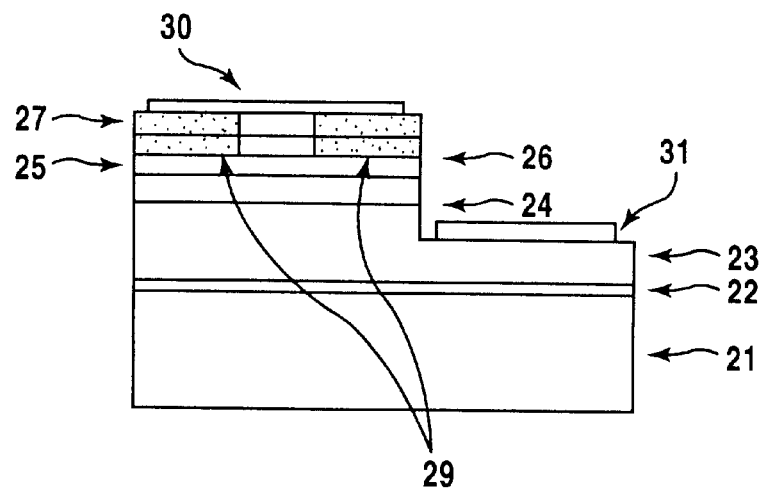

Subsequently, as shown in FIG. 2d, a p-electrode 10 covers the metal mask 8 and the contact layer 7. The p-electrode has a stripe shape having a width of about 200 $\mu$m larger than the above described width of the metal mask 8, and is formed by the evaporation of Ni at thickness 50 nm and Au at thickness 200 nm.

On the exposed portion of the n-type GaN layer 3, an electrode 11 is overlaid. The electrode 11 is formed by the evaporation of C, Ge of 50 nm in thickness and Al of 200 nm in thickness.

Thus, the III-V nitride semiconductor device is manufactured.

(III) Phenomena due to the metal mask 8

As described above, the contact resistance between the metal mask and the p-type contact layer 7 is reduced by the annealing process.

As a result of an experiment, it has been found that the contact resistance between Ni and p-type GaN is reduced from the order of $10^0$ $\Omega$cm to the order of $10^{-2}$ $\Omega cm^2$ by the annealing process. The same results as Ni were obtained by other metals such as Pt, Pd, Au etc.

The reason for the reduction of the contact resistance is thought to be as follows.

First, in the conventional method, the electrode is evaporated after the removing of the mask, thereby the surface of the semiconductor is exposed to the atmosphere. Consequently, the surface is promptly oxidized.

Since the oxidized film is an insulator, the film obstructs the injection of the electric current. Heretofore, after the oxidized film is removed, an electrode is formed on the surface. However, the oxidized film can not be perfectly be removed. Furthermore, before the electrode is formed, the surface is oxidized again. As a result, an oxidized film inevitably exists between the electrode and the GaN semiconductor. This is one of the reasons for the increasing of contact resistance.

In the present invention, since the mask is not removed, it is possible to prevent the oxidation after the removing of the mask. Also in the present invention, the oxidation before the forming of the mask can not be avoided. However, the film is very thin. Therefore it is considered that the metal of the mask penetrates the oxidized film and contacts directly with the III-V nitride semiconductor of the under layer, as a result it is possible to inject the electric current.

Second, in the case of the III-V nitride compound semiconductor, even if any metals contact with the semiconductor layer, a Schottky barrier exists between the metal and p-type GaN. Therefore, it is necessary to reduce the Schottky barrier in order to lower the contact resistance. As one of the methods for reducing the Schottky barrier, it is considered to react chemically a metal and the p-type GaN layer of the under layer with each other. However, any kinds of metal can not be used. For the present, as described above, Ni is excellent in reactivity with the III-V nitride compound semiconductor. Consequently, it seems that the contact resistance is reduced by the by annealing process.

As described above, in the present invention, since the metal mask is used, the process for removing the mask is unnecessary. Accordingly, it is possible to manufacture the semiconductor light emitting device with minimum steps of the process.

In addition, if the electric current injection area can be restricted by a simple method, the semiconductor can be manufactured by mass production. In addition, it is possible to obtain a semiconductor device having low contact resistance.

Although the above described embodiment has the double hetero structure, the present invention may be applied to other junction structures such as a pn homo-junction diode, separate confinement hetero structure, and others, and to the manufacture of a unipolar transistor such as FET.

In accordance with the present invention, the current path restriction structure can be made by the annealing process. Therefore the present invention is suitable for simplifying the manufacturing apparatus. By using the metal mask as the electrode, the resistance of the device is reduced, thereby increasing the device characteristic.

While the invention has been described in conjunction with preferred specific embodiment thereof, it will be understood that this description is intended to illustrate and not limit the scope of the invention, which is defined by the following claims.

What is claimed is:

1. A method for manufacturing a semiconductor light emitting device having a stack structure which consists of at least an n-type III-V nitride semiconductor layer, an active layer, and a p-type III-V nitride semiconductor layer on a substrate, comprising the steps of:

a first annealing process for the purpose of activating the p-type III-V nitride semiconductor layer;

forming a metal mask on the area of the III-V nitride semiconductor area where electric current is to be injected;

a second annealing process for inactivating the p-type III-V nitride semiconductor layer except for the masked area.

2. The method according to claim 1 wherein the first annealing process is performed in an ambience of nitrogen, and the second annealing process is performed in an ambience including hydrogen or hydrides.

3. The method according to claim 1 further comprising forming a p-electrode that covers the mask on the surface of the p-type and forming an n-electrode on the n-type III-V nitride semiconductor layer after the second annealing process.

4. The method according to claim 1 wherein the metal of the mask is one of Ni, Pt, Pd and Au.

* * * * *